US012633497B2

(12) United States Patent
Inagaki

(10) Patent No.: US 12,633,497 B2
(45) Date of Patent: May 19, 2026

(54) SUBSTRATE PROCESSING METHOD

(71) Applicant: Tokyo Electron Limited, Tokyo (JP)

(72) Inventor: Morihito Inagaki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 162 days.

(21) Appl. No.: 18/747,511

(22) Filed: Jun. 19, 2024

(65) Prior Publication Data

US 2025/0006462 A1     Jan. 2, 2025

(30) Foreign Application Priority Data

Jun. 27, 2023     (JP) .................................. 2023-105040

(51) Int. Cl.
*H01J 37/32*     (2006.01)
*C23C 16/455*     (2006.01)
*C23C 16/458*     (2006.01)

(52) U.S. Cl.
CPC .... *H01J 37/3211* (2013.01); *C23C 16/45536* (2013.01); *C23C 16/4584* (2013.01); *H01J 37/32926* (2013.01); *H01J 37/32981* (2013.01); *H01J 2237/3323* (2013.01)

(58) Field of Classification Search
CPC ............. H01J 37/3211; H01J 37/32926; H01J 37/32981; H01J 2237/3323; C23C 16/45536; C23C 16/4584
See application file for complete search history.

(56) References Cited

U.S. PATENT DOCUMENTS

| | | | | |
|---|---|---|---|---|
| 9,267,204 B2 * | 2/2016 | Honma | ............. | C23C 16/45551 |
| 11,901,158 B2 * | 2/2024 | Kobayashi | ........ | H01L 21/68764 |
| 12,368,030 B2 * | 7/2025 | Kato | ................. | H01J 37/32715 |
| 12,374,526 B2 * | 7/2025 | Kobayashi | ............ | C23C 16/402 |
| 2013/0047924 A1 * | 2/2013 | Enomoto | .......... | C23C 16/45551 |
| | | | | 118/725 |
| 2015/0126044 A1 * | 5/2015 | Kato | ................... | H01L 21/0228 |
| | | | | 118/723 R |
| 2016/0293390 A1 * | 10/2016 | Miura | ............... | H01L 21/68771 |
| 2018/0237914 A1 * | 8/2018 | Ogawa | ............. | H01L 21/68764 |

(Continued)

FOREIGN PATENT DOCUMENTS

| | | | | |
|---|---|---|---|---|
| JP | 2011040574 A | * | 2/2011 | ........... C23C 16/402 |
| JP | 6584355 B2 | | 10/2019 | |

(Continued)

*Primary Examiner* — Adam D Houston
(74) *Attorney, Agent, or Firm* — Venjuris, P.C.

(57) ABSTRACT

A substrate processing method includes providing a substrate processing apparatus including a vacuum container, a rotary table that includes a placement surface on which a plurality of substrates is disposed, and rotates the plurality of substrates, a plasma generator that includes an antenna and generates a plasma in the vacuum container, and a first driving unit that moves the antenna; storing ignition condition information that associate a process condition and a position of the antenna with each other, in a storage; determining the position of the antenna corresponding to the process condition of the ignition condition information that matches a process condition set in a recipe by referring to the storage; and moving the antenna to the determined position of the antenna using the first driving unit, thereby processing the plurality of the substrates.

6 Claims, 7 Drawing Sheets

(56)                  References Cited

U.S. PATENT DOCUMENTS

| | | | | |
|---|---|---|---|---|
| 2018/0308688 A1* | 10/2018 | Kato | .................. | C23C 16/4584 |
| 2023/0175137 A1* | 6/2023 | Inagaki | .................. | C23C 16/46 |
| | | | | 427/10 |
| 2023/0220550 A1* | 7/2023 | Inagaki | .................. | C23C 16/52 |
| | | | | 427/8 |
| 2023/0402256 A1* | 12/2023 | Chiba | ................ | C23C 16/4412 |
| 2025/0006462 A1* | 1/2025 | Inagaki | ............ | C23C 16/45536 |
| 2025/0140524 A1* | 5/2025 | Matsumoto | ....... | H01J 37/32926 |
| 2025/0140539 A1* | 5/2025 | Inagaki | ............ | H01J 37/32935 |

FOREIGN PATENT DOCUMENTS

| | | | | |
|---|---|---|---|---|
| JP | 2022-112423 A | 8/2022 | | |
| KR | 20210040927 A | * 4/2021 | ............ | C23C 16/50 |

* cited by examiner

| ITEM | Step1 | Step2 | Step3 |
|---|---|---|---|
| GAS 1 (GAS FLOW RATE) | 0sccm | 1000sccm | 1400sccm |
| GAS 2 (GAS FLOW RATE) | 0sccm | 2000sccm | 2800sccm |
| GAS 3 (GAS FLOW RATE) | 7000sccm | 4000sccm | 4400sccm |
| PRESSURE | 1.8Torr | 1.8Torr | 2.2Torr |
| RF POWER | 0W | 1000W | 3000W |
| ⋮ | ⋮ | ⋮ | ⋮ |
| Table | 1 | | |

| ANTENNA POSITION | SETTING VALUE |
|---|---|
| POSITION 1 | 1.0mm |
| POSITION 2 | 2.0mm |
| POSITION 3 | 3.0mm |
| POSITION 4 | 4.0mm |
| POSITION 5 | 5.0mm |

FIG. 7

| Table | | GAS 1 (GAS FLOW RATE) | GAS 2 (GAS FLOW RATE) | GAS 3 (GAS FLOW RATE) | PRESSURE | RF POWER | ANTENNA POSITION |
|---|---|---|---|---|---|---|---|
| Table 1 | 111 | 1000sccm | 2000sccm | 4000sccm | 1.8Torr | 1000W | POSITION 1 |
| Table 2 | 112 | 1100sccm | 2200sccm | 4100sccm | 1.9Torr | 1500W | POSITION 2 |
| Table 3 | 113 | 1200sccm | 2400sccm | 4200sccm | 2.0Torr | 2000W | POSITION 3 |
| Table 4 | 114 | 1300sccm | 2600sccm | 4300sccm | 2.1Torr | 2500W | POSITION 4 |
| Table 5 | 115 | 1400sccm | 2800sccm | 4400sccm | 2.2Torr | 3000W | POSITION 5 |

110    110a    110b

SUBSTRATE PROCESSING METHOD

CROSS-REFERENCE TO RELATED APPLICATIONS

This application is based on and claims priority from Japanese Patent Application No. 2023-105040 filed on Jun. 27, 2023, with the Japan Patent Office, the disclosure of which is incorporated herein in its entirety by reference.

TECHNICAL FIELD

The present disclosure relates to a substrate processing method.

BACKGROUND

Japanese Patent No. 6584355 and Japanese Patent Laid-Open Publication No. 2022-112423 disclose a processing apparatus including an antenna provided to be movable above a processing chamber, the processing apparatus capable of locally irradiating a rotary table with plasma when performing film formation while rotating a plurality of substrates placed on the rotary table.

SUMMARY

According to an aspect of the present disclosure, a substrate processing method includes providing a substrate processing apparatus including a vacuum container, a rotary table that includes a placement surface on which a plurality of substrates is disposed, and rotates the plurality of substrates, a plasma generator that includes an antenna and generates a plasma in the vacuum container, and a first driving unit that moves the antenna; storing ignition condition information that associates a process condition and a position of the antenna, in a storage; determining the position of the antenna corresponding to the process condition of the ignition condition information that matches a process condition set in a recipe by referring to the storage; and moving the antenna to the determined position of the antenna using the first driving unit, thereby processing the plurality of the substrates.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a diagram illustrating an example of a recipe according to an embodiment.

FIG. 6 is a diagram illustrating an example of antenna position setting information according to an embodiment.

FIG. 7 is a diagram illustrating an example of an ignition condition table according to an embodiment.

DETAILED DESCRIPTION

Figure 1:
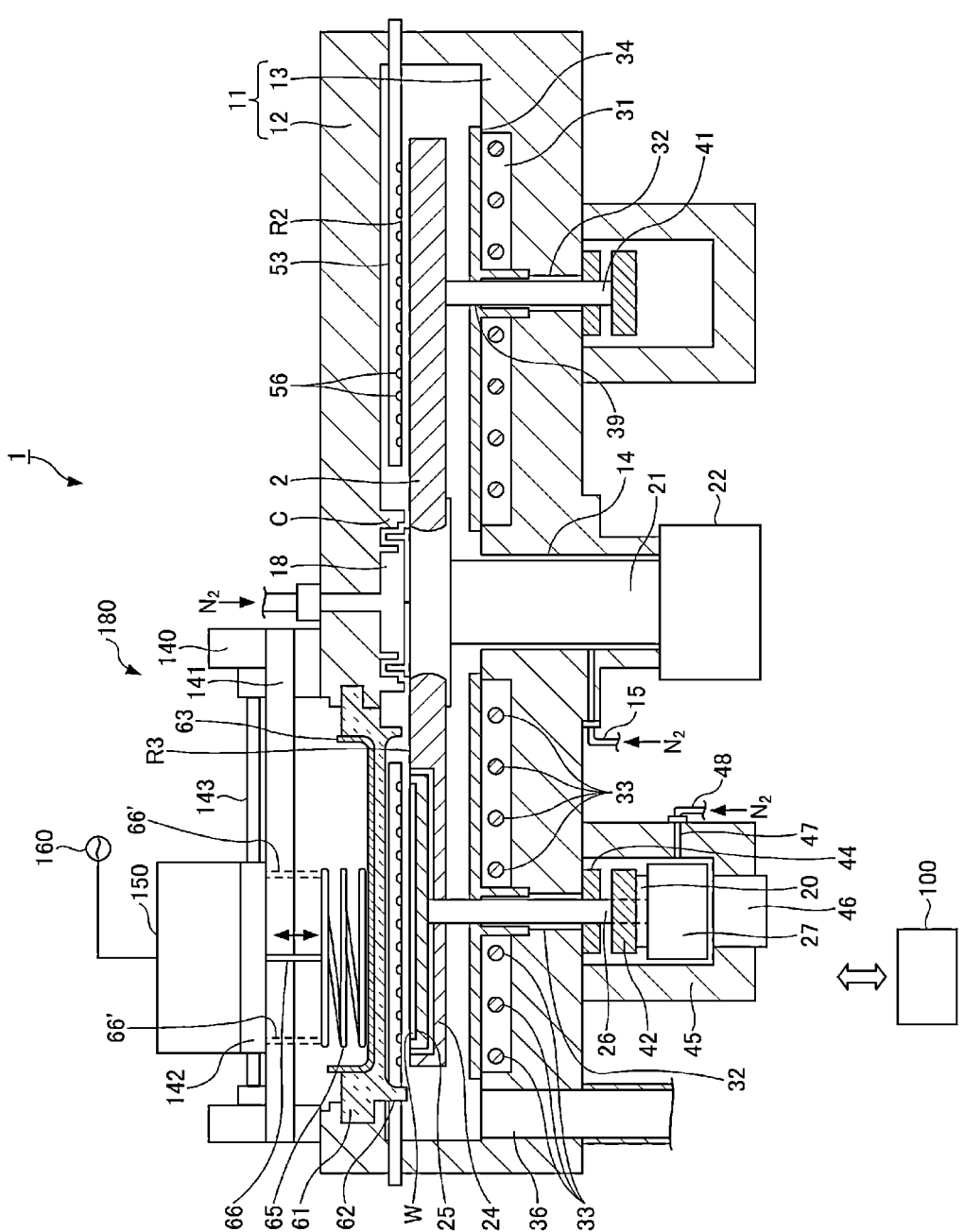
FIG. 1 is a longitudinal-sectional side view illustrating an example of a film forming apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same reference numerals may be given to the same components, and redundant descriptions may be omitted.

[Film Forming Apparatus]

Figure 2:
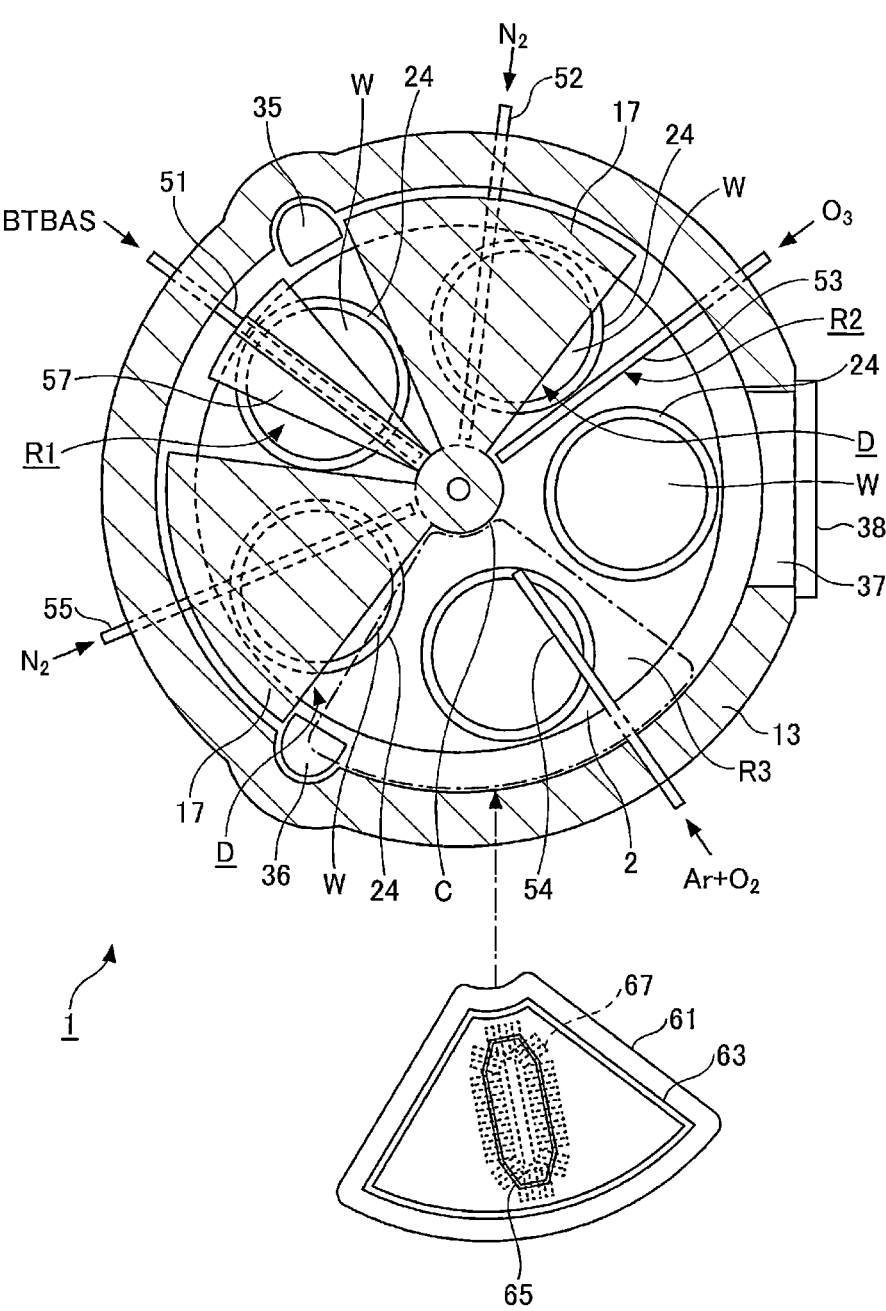
FIG. 2 is a cross-sectional plan view illustrating an example of a film forming apparatus according to an embodiment.

A film forming apparatus 1 according to the embodiments of the present disclosure will be described with reference to FIGS. 1 and 2. FIG. 1 is a longitudinal-sectional side view illustrating an example of a film forming apparatus according to an embodiment. FIG. 2 is a cross-sectional plan view illustrating an example of a film forming apparatus according to an embodiment. The film forming apparatus 1 is an example of a substrate processing apparatus capable of executing a substrate processing method to be described hereinbelow. The film forming apparatus 1 includes a substantially circular flat vacuum container 11 and a disc-shaped horizontal rotary table 2 provided in the vacuum container 11. The vacuum container 11 includes an upper plate 12 and a container body 13. The container body 13 forms the sidewall and bottom of the vacuum container 11.

A central shaft 21 is provided at the center of the vacuum container 11 to extend vertically downward from a central portion of the rotary table 2. The central shaft 21 is connected to an orbiting rotational driving unit 22, which is provided to block an opening 14 formed at the bottom of the container body 13. The rotary table 2 is supported in the vacuum container 11 via the central shaft 21 and the orbiting rotational driving unit 22. The rotary table 2 rotates clockwise or counterclockwise when viewed from the plane of the film forming apparatus 1. The orbiting rotational driving unit 22 is, for example, an electric actuator such as a motor. A gas supply pipe 15 discharges $N_2$ (nitrogen) gas to a gap between the central shaft 21 and the container body 13, thereby preventing a raw material gas and an oxidizing gas from flowing from a surface to a back surface of the rotary table 2.

Further, the upper plate 12 of the vacuum container 11 has, at a lower surface thereof, a central region forming portion C, which is circular in plan view and protrudes to face the central portion of the rotary table 2, and two convex portions 17, which spread from the central region forming portion C toward the outside of the rotary table 2 as illustrated in FIG. 2. The two convex portions 17 have a substantially fan-shaped planar shape with the top cut in an arc shape.

These central region forming portion C and convex portions 17 form a lower ceiling surface compared to an outer region thereof. A gap between the central region forming portion C and the central portion of the rotary table 2 form a flow path 18 for $N_2$ gas (see, e.g., FIG. 1). During the processing of a wafer W, which is an example of a substrate, $N_2$ gas is supplied to the flow path 18 from a gas supply pipe connected to the upper plate 12 and flows from the flow path 18 toward the entire outer circumference of the rotary table 2. The $N_2$ gas prevents a raw material gas and oxidizing gas from coming into contact with each other on the central portion of the rotary table 2.

A flat ring-shaped recess 31 is formed at the bottom of the container body 13 to extend along the circumference of the rotary table 2 below the rotary table 2. A ring-shaped slit 32 is opened at a bottom surface of the recess 31 along the circumferential direction of the recess 31. The slit 32 is formed to penetrate the bottom of the container body 13 in the thickness direction. Furthermore, seven ring-shaped heaters 33 are arranged on the bottom surface of the recess 31 to heat the wafer W placed on the rotary table 2.

The heaters 33 are arranged along concentric circles centered on the rotation center of the rotary table 2, with four of the seven heaters 33 provided inside the slit 32 and the other three provided outside the slit 32. Further, a shield 34 is provided to cover the upper side of each heater 33 and to block the upper side of the recess 31. A ring-shaped slit 39 is formed at the shield 34 to overlap with the slit 32, and a strut 41 penetrates the slits 32 and 39. Further, exhaust ports 35 and 36 are opened at the bottom of the container body 13 outside the recess 31 to exhaust the inside of the vacuum container 11 (see, e.g., FIGS. 1 and 2). An exhaust mechanism (not illustrated) combined with a vacuum pump and other components is connected to the exhaust ports 35 and 36.

As illustrated in FIG. 2, five circular recesses are formed at the surface of the rotary table 2 along the rotation direction of the rotary table 2, and a circular wafer holder 24 is provided in each recess. As illustrated in FIG. 1, a recess 25 is formed at a surface of the wafer holder 24, and the wafer W is accommodated horizontally in the recess 25. Accordingly, a bottom surface of the recess 25 forms a placement surface where the wafer W is placed. In this example, the height of the sidewall of the recess 25 is, for example, 1 mm, which is the same as the thickness of the wafer W.

For example, three struts 41 extend vertically downward from the back surface of the rotary table 2 at positions spaced apart from each other in the circumferential direction. As illustrated in FIG. 1, each strut 41 penetrates the bottom of the container body 13 through the slits 32 and 39 and is connected to a support ring 42, which is a connector provided below the container body 13. The support ring 42 is formed along the rotation direction of the rotary table 2 and is installed horizontally to hang from the container body 13 by the strut 41, thus rotating together with the rotary table 2.

Further, a rotating shaft 26, which is a rotating shaft that turns, extends vertically downward from a lower central portion of the wafer holder 24. A lower end of the rotating shaft 26 penetrates the rotary table 2, then penetrates the bottom of the container body 13 through the slit 32, and further penetrates the support ring 42 as well as a magnetic seal unit 20 provided below the support ring 42, thus being connected to a turning rotational driving unit 27. The magnetic seal unit 20 includes a bearing that rotatably supports the rotating shaft 26 relative to the support ring 42 and a magnetic seal (e.g., magnetic fluid seal) that seals a gap around the rotating shaft 26.

The magnetic seal is provided to prevent particles generated from the bearing, such as lubricating oil used in the bearing, from diffusing to the external vacuum atmosphere of the magnetic seal unit 20. Further, the wafer holder 24 is, for example, slightly floating from the rotary table 2 with the rotating shaft 26 supported by the bearing. Further, the turning rotational driving unit 27 is provided below the support ring 42 so as to be supported by the support ring 42 via the magnetic seal unit 20, and rotates the rotating shaft 26 around its axis. The turning rotational driving unit 27 is, for example, an electric actuator such as a motor. In the film forming apparatus 1, as the rotary table 2 rotates, the wafer W undergoes orbital rotation, and the wafer holder 24 rotates in parallel with the rotation of the rotary table 2, causing the wafer W to turn around its axis.

A shield ring 44 is provided to block the slit 32 of the container body 13 from below the container body 13, as illustrated in FIG. 1, and is configured to rotate together with the rotary table 2. Accordingly, the above-mentioned rotating shaft 26 and strut 41 are provided to penetrate the shield ring 44. The shield ring 44 serves as a heat shield to prevent the turning rotational driving unit 27 from being exposed to each gas and from being excessively heated.

Further, a lower wall 45 is formed to have a recessed shape in cross-section below the container body 13 to surround the support ring 42, turning rotational driving unit 27, and shield ring 44. The lower wall 45 is formed in a ring shape along the rotation direction of the rotary table 2. Further, five chargers 46 (only one is illustrated in FIG. 1) are provided at the bottom of the lower wall 45 at intervals in the circumferential direction. When no processing is performed on the wafer W, the rotary table 2 is stationary so that the turning rotational driving unit 27 is positioned directly below the charger 46, allowing charging of each turning rotational driving unit 27 via non-contact feeding from the charger 46. A gas supply path 47 is open to a space surrounded by the lower wall 45. For example, during the processing of the wafer W, a gas nozzle 48 supplies $N_2$ gas to the space surrounded by the lower wall 45 through the gas supply path 47 to purge the space. For example, the space is in communication with an exhaust path interconnecting the exhaust ports 35 and 36 and the exhaust mechanism (not illustrated), so that even when particles are generated in the space, the particles are purged and removed by the $N_2$ gas.

The sidewall of the container body 13 is provided with a transfer port 37 for the wafer W and a gate valve 38 for opening or closing the transfer port 37 (see FIG. 2), and the wafer W is transferred between a transfer device introduced into the vacuum container 11 through the transfer port 37 and the recess 25. Specifically, through-holes are formed at corresponding positions, respectively, at the bottom surface of the recess 25, the bottom of the container body 13, and the rotary table 2, and tips of pins are elevated through the respective through-holes. The wafer W is transferred via the pins. The illustration of the pins and through-holes for the passage of the pins therethrough is omitted.

Further, as illustrated in FIG. 2, a raw material gas nozzle 51, a separation gas nozzle 52, an oxidizing gas nozzle 53, a plasma generation gas nozzle 54, and a separation gas nozzle 55 are arranged on the rotary table 2 in this order at intervals in the rotation direction of the rotary table 2. Each of the gas nozzles 51 to 55 is formed in a rod shape to extend horizontally along the diameter of the rotary table 2 from the sidewall to the center of the vacuum container 11, and discharges a gas from a plurality of discharge ports formed along the diameter. Each of the gas nozzles 51 to 55 is an example of a gas supply that supplies a gas into the vacuum container 11.

For example, the film forming apparatus 1 performs formation of a $SiO_2$ film on the wafer W by atomic layer deposition (ALD). In this case, the film forming apparatus 1 supplies a bis(tertiary-butyl)aminosilane (BTBAS) gas as a raw material gas to the wafer W, and causes the BTBAS gas to be adsorbed onto the substrate W. Ozone ($O_3$) gas, which is an oxidizing gas for oxidizing the adsorbed BTBAS gas, is supplied to form a molecular layer of silicon oxide ($SiO_2$), which is then exposed to a plasma generated from a plasma generation gas, thereby modifying the molecular layer. This series of processing is repeated multiple times to form a $SiO_2$ film.

The raw material gas nozzle 51, which forms a processing gas supply mechanism, discharges the bis(tertiary-butyl) aminosilane (BTBAS) gas. A nozzle cover 57 covers the raw material gas nozzle 51 and is formed in a fan shape spreading from the raw material gas nozzle 51 toward both upstream and downstream of the rotation direction of the rotary table 2. The nozzle cover 57 serves to increase the concentration of the BTBAS gas below it, increasing the adsorption of the BTBAS gas onto the wafer W. Further, the oxidizing gas nozzle 53 discharges the ozone gas ($O_3$). The separation gas nozzles 52 and 55 are gas nozzles that discharge $N_2$ gas, and are arranged to divide the fan-shaped convex portions 17 of the upper plate 12 in the circumferential direction, respectively. The plasma generation gas nozzle 54 discharges a plasma generation gas including, for example, a mixed gas of argon (Ar) gas and oxygen ($O_2$) gas.

The upper plate 12 has a fan-shaped opening formed along the rotation direction of the rotary table 2, and a cup-shaped sapphire glass 61, which is made of a dielectric such as quartz and has a shape corresponding to that of the opening, is formed to block the opening (see e.g., FIGS. 1 and 2). The sapphire glass 61 is provided between the oxidizing gas nozzle 53 and a protrusion 62 when viewed in the rotation direction of the rotary table 2. In FIG. 2, the position where the sapphire glass 61 is provided is illustrated by a dashed line. The protrusion 62 is formed along the circumferential edge of a lower surface of the sapphire glass 61. A tip end of the plasma generation gas nozzle 54 penetrates the protrusion 62 from the outer peripheral side of the rotary table 2 so as to be able to discharge a gas to a region surrounded by the protrusion 62. The protrusion 62 serves to prevent the $N_2$ gas, ozone gas, and BTBAS gas from entering below the sapphire glass 61, thereby preventing a decrease in the concentration of the plasma generation gas.

A recess is formed at the upper side of the sapphire glass 61, and a box-shaped Faraday shield 63, which is open upward, is located in the recess. An antenna 65 is provided on a bottom surface of the Faraday shield 63 via an insulating plate member. The antenna 65 is configured such that a metal wire is wound in a coil shape around a vertical axis. A support 66 is connected to the antenna 65 and is also connected to a matcher 150 and a radio frequency power supply 160 through the support 66. A slit 67 is formed at the bottom surface of the Faraday shield 63 to prevent an electric field component of the electromagnetic field generated in the antenna 65 when applying radio frequency power to the antenna 65 from propagating downward and to direct a magnetic field component downward (see e.g., FIG. 2). The slit 67 extends in a direction perpendicular to (intersecting) the winding direction of the antenna 65, and is formed in large numbers along the winding direction of the antenna 65. With the components configured as described above, the antenna 65 is coupled to the vacuum container 11 and is configured to generate a plasma in the vacuum container 11. When the radio frequency power supply 160 is turned on to apply radio frequency power to the antenna 65, it is possible to form a plasma from the plasma generation gas supplied below the sapphire glass 61.

A plasma generator 180 having the movably provided antenna 65 is provided above the vacuum container 11. The plasma generator 180 includes the antenna 65, the support 66, an electric actuator 140, a frame 141, a fixing element 142, and a driving force transmitter 143. The frame 141 serves as a base to install the electric actuator 140 on the upper plate 12 forming an upper surface of the vacuum container 11. The support 66 is connected to the upper center of the antenna 65 to support the antenna 65. The support 66 is fixed to the fixing element 142, and the antenna 65 hands from the support 66. The electric actuator 140, such as a motor, vertically moves (raises and lowers) the fixing element 142 via the driving force transmitter 143. The driving force transmitter 143 transmits a driving force to the fixing element 142 to move the fixing element 142 up and down. Thus, the plasma generator 180 may move the antenna 65 supported by the support 66 in the vertical direction of the rotary table 2 by the driving of the electric actuator 140. In this configuration, a driving system (electric actuator 140, frame 141, fixing element 142, driving force transmitter 143, and support 66) of the plasma generator 180 is an example of a first driving unit configured to move the antenna 65. In addition, the electric actuator 140 may also move the fixing element 142 horizontally via the driving force transmitter 143.

On the rotary table 2, a region below the nozzle cover 57 of the raw material gas nozzle 51 is referred to as an adsorption region R1 where the BTBAS gas serving as the raw material gas is adsorbed, and a region below the oxidizing gas nozzle 53 is referred to as an oxidation region R2 where the BTBAS gas is oxidated by the ozone gas. Further, a region below the sapphire glass 61 is referred to as a plasma formation region R3 where a $SiO_2$ film is modified by a plasma. Regions below the convex portions 17 are referred to as separation regions D, respectively, by which the adsorption region R1 and the oxidation region R2 are separated from each other, which allows the $N_2$ gas discharged from the separation gas nozzles 52 and 55 to prevent mixing of the raw material gas and the oxidizing gas.

The exhaust port 35 is open outward between the adsorption region R1 and the separation region D adjacent thereto downstream in the rotation direction, and exhausts the excess BTBAS gas. The exhaust port 36 is open outward near the boundary between the plasma formation region R3 and the separation region D adjacent thereto downstream in the rotation direction, and exhausts the excess $O_3$ gas and plasma generation gas. The $N_2$ gas supplied respectively from each separation area D, the gas supply pipe 15 below the rotary table 2, and the central region forming portion C of the rotary table 2 is also exhausted from the respective exhaust ports 35 and 36.

The film forming apparatus 1 is provided with a controller 100 that controls the operation of the entire apparatus. The controller 100 is configured with, for example, a computer. The controller 100 stores a program for executing a substrate processing method. The program sends control signals to each part of the film forming apparatus 1 to control the operation of each part. For example, the flow rates of gases supplied from the gas holes 56 of the respective gas nozzles 51 to 55, the temperature of the wafer W by the heater 33, and the amount of $N_2$ gas supplied from the gas supply pipe 15, the rotational speeds of the rotary table 2 and wafer holder 24, and the position of the antenna 65 are controlled in response to the control signals. Further, recipes (programs) are set with process conditions for executing a substrate processing method step by step. The recipes and other programs are installed in the controller 100 from a storage medium such as a hard disk, compact disk, magneto-optical disk, memory card, or flexible disk.

[Controller]

Figure 3:
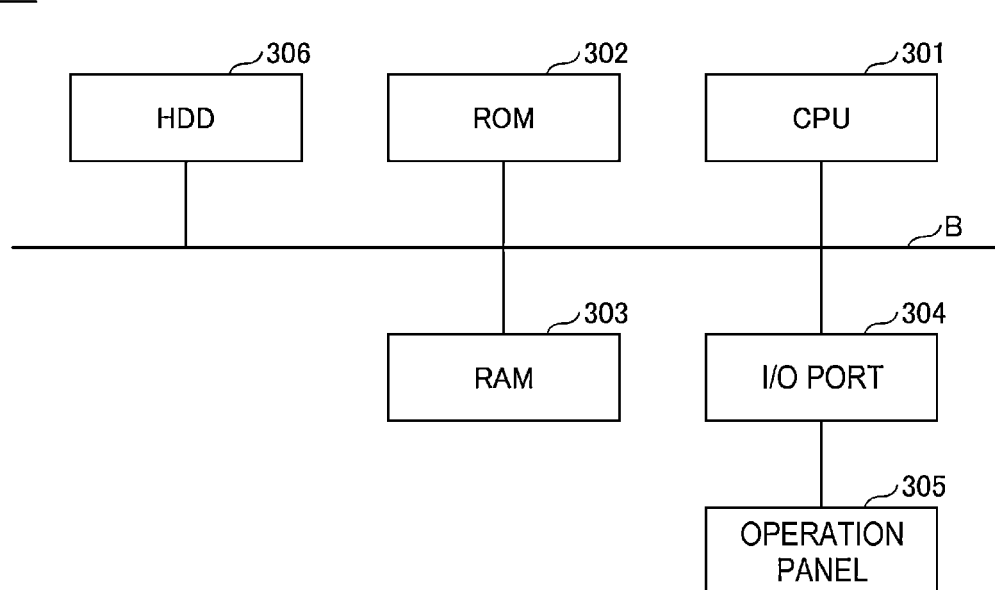
FIG. 3 is a diagram illustrating an example of a hardware configuration of a controller according to an embodiment.
Figure 4:
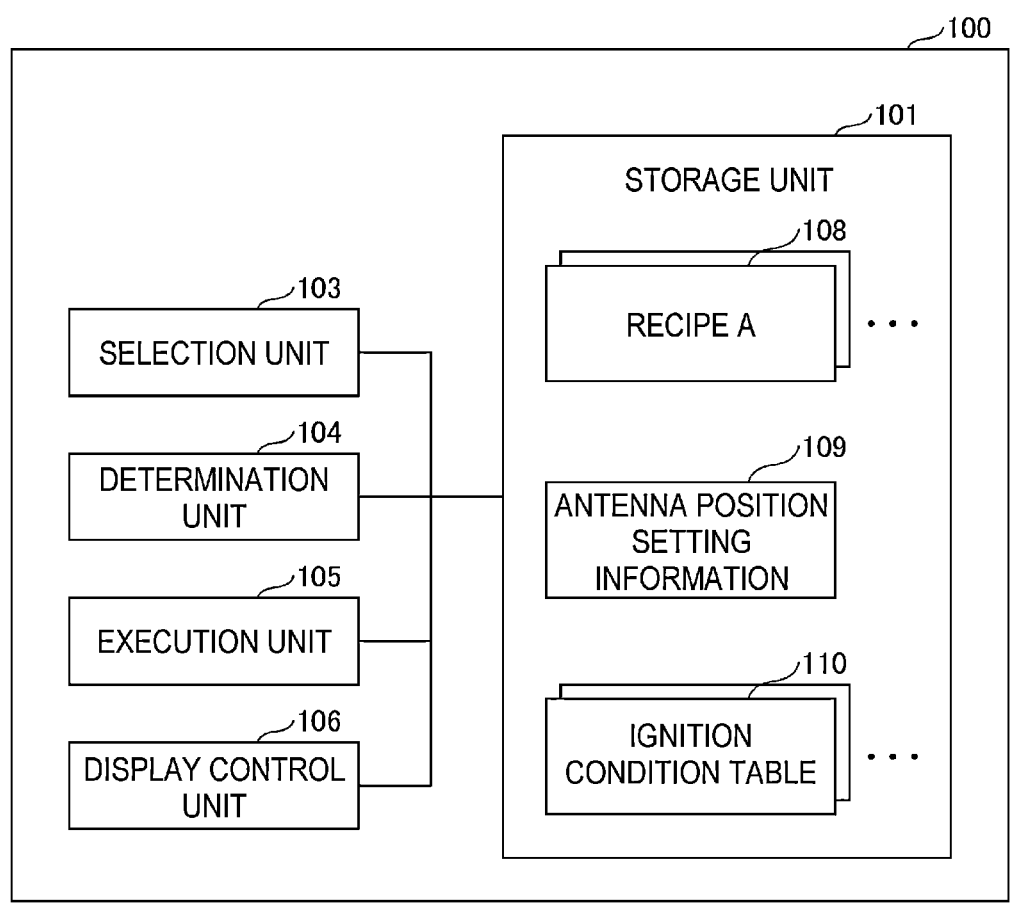
FIG. 4 is a diagram illustrating an example of a functional configuration of the controller according to an embodiment.

Next, an example of a hardware configuration and functional configuration of the controller 100 according to an embodiment will be described with reference to FIGS. 3 and 4. FIG. 3 is a diagram illustrating an example of a hardware configuration of the controller 100 according to an embodiment. FIG. 4 is a diagram illustrating an example of a functional configuration of the controller 100 according to an embodiment. As illustrated in FIG. 3, the controller 100 includes a central processing unit (CPU) 301, a read only memory (ROM) 302, a random access memory (RAM) 303, an I/O port 304, an operation panel 305, and a hard disk drive (HDD) 306. The respective parts are connected by a bus B.

The CPU 301 controls the operation of the controller 100 based on recipes and other programs. For example, the CPU 301 controls substrate processing of a plurality of wafers W placed on the rotary table 2 based on recipes.

The ROM 302 is a storage medium including, for example, an electrically erasable programmable ROM (EE-PROM), flash memory, and hard disk to store the recipes and other programs of the CPU 301. The RAM 303 functions as, for example, a work area of the CPU 301.

The I/O port 304 acquires detected values of various sensors, which are attached to the film forming apparatus 1 to detect temperature, pressure, gas flow rate, and others, and transmits them to the CPU 301. Further, the I/O port 304 outputs the control signals from the CPU 301 to each part of the film forming apparatus 1 (rotary table 2, vacuum pump, etc.). Further, the I/O port 304 is connected to the operation panel 305 through which an operator operates the film forming apparatus 1. The HDD 306 may be an auxiliary storage device, and may store recipes, programs, and others that define a substrate processing sequence.

In an example of a functional configuration as illustrated in FIG. 4, the controller 100 includes a storage unit 101, a selection unit 103, a determination unit 104, a process execution unit 105, and a display control unit 106. The selection unit 103, determination unit 104, process execution unit 105, and display control unit 106 are realized, for example, by causing the CPU 301 illustrated in FIG. 3 to execute the recipes and other programs loaded on the RAM 303. The storage unit 101 is implemented by, for example, the ROM 302, RAM 303, or HDD 306 illustrated in FIG. 3.

The storage unit 101 stores a recipe 108 (e.g., Recipe A) indicating a substrate processing sequence executed by the film forming apparatus 1. FIG. 5 is a diagram illustrating an example of the recipe 108 according to an embodiment. For example, the recipe 108 includes steps such as Step 1, Step 2, and Step 3, and an item indicating a process condition 108*a* for each step. Additionally, the recipe 108 includes an item indicating ignition condition table information (Table) 108*b*. For example, in Steps 1 to 3, Table 1 is designated as the ignition condition table information 108*b*. The ignition condition table information 108*b* is selected from among a plurality of ignition condition tables 110 (see, e.g., FIG. 7) stored in the storage unit 101.

Further, the storage unit 101 stores antenna position setting information 109. FIG. 6 is a diagram illustrating an example of the antenna position setting information 109 according to an embodiment. The antenna position setting information 109 stores a correspondence between Positions 1 to 5 of the antenna 65 and setting values 1 to 5 mm of the antenna 65 from the origin position of the antenna 65, which is set to 0 mm. For example, Position 1 of the antenna 65 is set 1 mm higher than the origin position of the antenna 65. In the example of FIG. 6, five positions of the antenna 65 are set, but are not limited thereto, and a greater number of positions of the antenna 65 may be set.

Furthermore, the storage unit 101 stores the ignition condition tables 110. FIG. 7 is a diagram illustrating an example of the ignition condition tables 110 according to an embodiment. The ignition condition tables 110 store ignition condition information 111 to 115 where process conditions 110*a* and antenna positions 110*b* are associated with each other. A plurality of pieces of ignition condition information may be stored for each of five ignition condition tables 110 (Tables 1 to 5).

The process conditions 110*a* include process conditions related to plasma ignition conditions among plasma conditions set in the recipe 108. In an example of FIG. 7, each ignition condition information 111 to 115 store gas species, gas flow rate of each gas, pressure in the vacuum container 11, and RF power supplied to the antenna 65. While multiple gas species may be set, a single gas may also be set. In the example of FIG. 7, three gas species are set.

A plasma ignition state varies depending on the gas species, gas flow rate, pressure, and RF power. For example, when the gas species is a hydrogen gas, it is more prone to ignition. In the meantime, ignition tends to be difficult with a relatively lower gas flow rate. Also, a relatively higher pressure in the vacuum container 11 or a relatively higher RF power makes ignition easier.

Therefore, the process conditions 110*a* of the ignition condition information 111 to 115 include at least factors contributing to a variation in the plasma ignition state, such as gas species, gas flow rate of each gas, pressure in the vacuum container 11, and RF power supplied to the antenna 65. The storage unit 101 stores the antenna position 110*b* for each process condition 110*a* of multiple pieces of ignition condition information 111 to 115.

The selection unit 103 selects an ignition condition table identified in the recipe 108 from the plurality of ignition condition tables 110 stored in the storage unit 101. In the example of FIG. 5, the selection unit 103 selects "Table 1" identified in the ignition condition table information 108*b* of the recipe 108.

The determination unit 104 refers to the selected ignition condition table to determine the antenna position 110*b* corresponding to the process condition 110*a* that matches the process condition set in the recipe 108.

The process execution unit 105 moves the antenna 65 to the determined antenna position using the electric actuator 140. After moving the antenna 65, the process execution unit 105 controls process conditions according to a designated recipe to simultaneously process a plurality of wafers W placed on the rotary table 2.

The display control unit 106 displays various screens, such as a screen for setting the antenna position setting information 109 and a screen for selecting the ignition condition tables 110 identified in the recipe 108, on the operation panel 305 operated by the operator. The display control unit 106 may also display the recipe 108. The operation panel 305 is an example of a display device.

[Substrate Processing Method]

Figure 8:
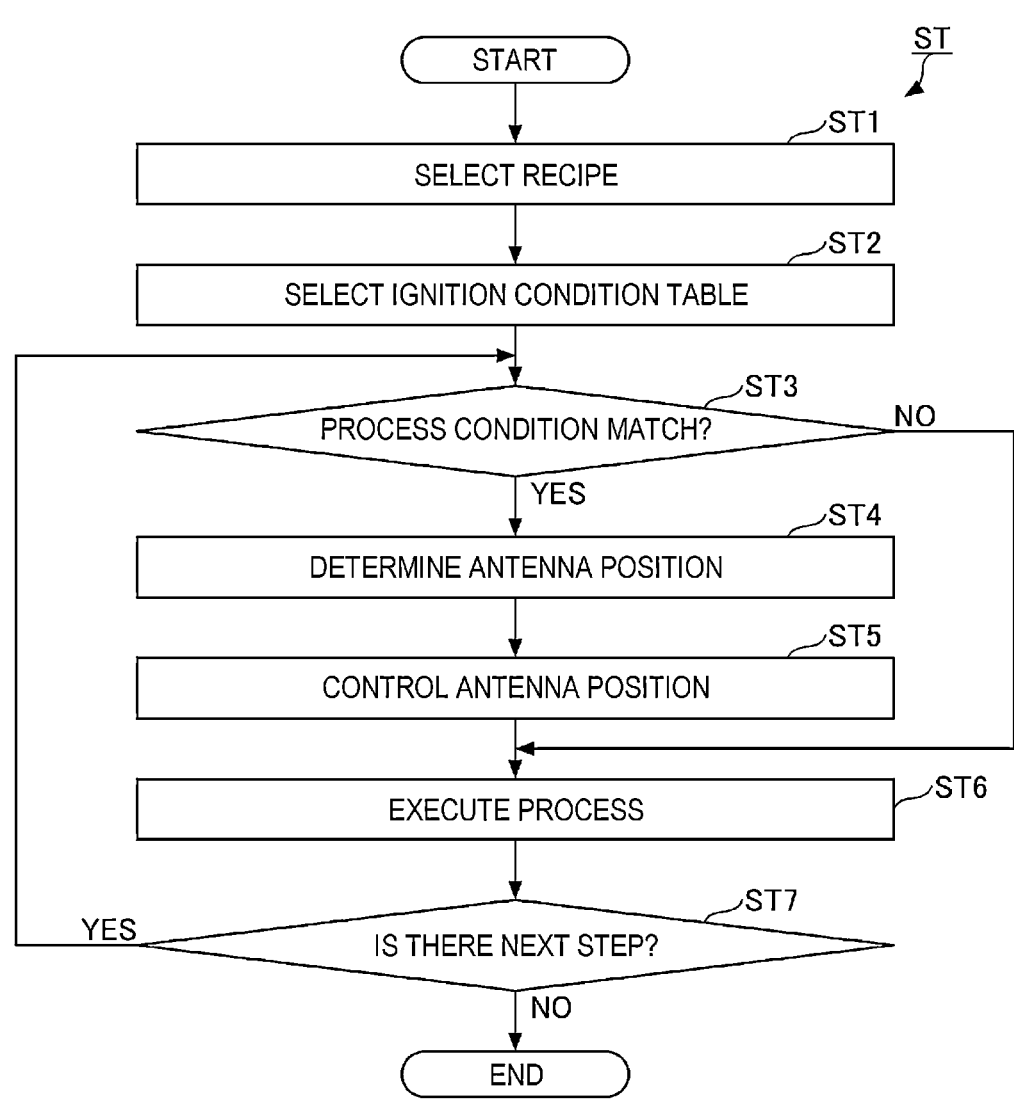
FIG. 8 is a flowchart illustrating an example of a substrate processing method according to an embodiment.

Next, a substrate processing method executed by the film forming apparatus 1 will be described with reference to FIG. 8. FIG. 8 is a flowchart illustrating an example of a substrate processing method ST according to an embodiment. For example, the substrate processing method ST is controlled by the controller 100 and is executed by the film forming apparatus 1.

In the substrate processing method ST, firstly, in step ST1, the selection unit 103 selects a recipe. Next, in step ST2, the selection unit 103 selects an ignition condition table identified in the selected recipe. When the recipe 108 illustrated in FIG. 5 is selected, the selection unit 103 selects "Table 1" in step ST2.

Next, in step ST3, the determination unit 104 determines which of the process conditions 110a set in the ignition condition information of the selected ignition condition table matches the process condition set in Step 1 of the recipe.

In the example of FIG. 7, the determination unit 104 searches for one of the process conditions 110a of the ignition condition information 111 to 115 set in the ignition condition table 110 of "Table 1" that matches the process condition 108a set in Step 1 of the recipe 108 illustrated in FIG. 5.

In this case, none of the process conditions 110a of the ignition condition information 111 to 115 matches the process condition 108a set in Step 1 of the recipe 108. Therefore, the determination unit 104 determines "No" in step ST3 and proceeds to step ST6. The process execution unit 105 controls the process condition of Step 1 of the recipe without moving the position of the antenna 65 from the origin position to process the plurality of wafers W placed on the rotary table 2.

Next, in step ST7, the process execution unit 105 determines whether there is a next step in the recipe. In the example of FIG. 5, the recipe 108 has a next step (Step 2). Thus, the process execution unit 105 determines "Yes" in step ST7 and returns to step ST3. The determination unit 104 determines which of the process conditions 110a set in the ignition condition table 110 of "Table 1" matches the process condition 108a set in Step 2 of the recipe.

In case of FIGS. 5 and 7, among the process conditions 110a of the ignition condition table 110, the process condition 110a of the ignition condition information 111 matches the process condition 108a set in Step 2 of the recipe 108. Therefore, the determination unit 104 determines "Yes" in step ST3, and proceeds to step ST4, where the determination unit 104 determines the position of the antenna 65 as the antenna position 110b of the ignition condition information 111. In the example of FIG. 7, the determination unit 104 determines "Position 1" of the ignition condition information 111.

Next, in step ST5, the process execution unit 105 moves the antenna 65 to the determined antenna position using the electric actuator 140. In the example of FIG. 7, the process execution unit 105 moves the antenna 65 to Position 1. Thus, as illustrated in FIG. 6, the position of the antenna 65 is lifted by 1 mm from the origin position of the antenna 65.

After moving the antenna 65, the process execution unit 105 controls the process condition of the designated recipe to simultaneously process the plurality of wafers W placed on the rotary table 2.

Next, in step ST7, the process execution unit 105 determines whether there is a next step in the recipe. In the example of FIG. 5, the recipe 108 has a next step (Step 3). Thus, the process execution unit 105 determines "Yes" in step ST7 and returns to step ST3. The determination unit 104 determines which of the process conditions 110a set in the ignition condition table 110 of "Table 1" matches the process condition 108a set in Step 3 of the recipe.

In case of FIGS. 5 and 7, among the process conditions 110a of the ignition condition table 110, the process condition 110a of the ignition condition information 115 matches the process condition 108a set in Step 3 of the recipe 108. Therefore, the determination unit 104 determines "Yes" in step ST3 and proceeds to step ST4, where the determination unit 104 determines the position of the antenna 65 as the antenna position 110b of the ignition condition information 115. In the example of FIG. 7, the determination unit 104 determines "Position 5" of the ignition condition information 115.

Next, in step ST5, the process execution unit 105 moves the antenna 65 to the determined antenna position using the electric actuator 140. In the example of FIG. 7, the process execution unit 105 moves the antenna 65 to Position 5. Thus, as illustrated in FIG. 6, the position of the antenna 65 is lifted by 5 mm from the origin position of the antenna 65.

After moving the antenna 65, the process execution unit 105 controls the process condition of the designated recipe to simultaneously process the plurality of wafers W placed on the rotary table 2.

Next, in step ST7, the process execution unit 105 determines whether there is a next step in the recipe. In the example of FIG. 5, there is no next step after Step 3 in the recipe 108. Thus, this processing is terminated.

As described above, according to the substrate processing method of the present embodiment, in the ignition condition table 110, the ignition condition information 111 to 115 store the process conditions 110a related to the plasma ignition conditions and the antenna positions 110b in association with each other. Then, the position (height) of the antenna 65 is automatically adjusted to the antenna position 110b corresponding to the process condition 110a of the ignition condition information that matches the process condition 108a set in the recipe. As a result, a stable plasma ignition may be achieved under appropriate plasma ignition conditions by optimizing the position of the antenna 65. This enhances the in-plane uniformity of a film in substrate processing using a plasma, improving process performance.

Further, by optimizing the position of the antenna 65, it is possible to protect the equipment around the antenna 65. When the process is performed with the antenna 65 at the same position as that during RF ignition, the damage to the equipment around the antenna 65 may become significant. For example, as illustrated in FIG. 1, the sapphire glass 61 located near the antenna 65 is prone to the damage when the antenna 65 approaches. Therefore, for example, the position of the antenna 65 during the process of a subsequent step is automatically adjusted to be higher than the position of the antenna 65 during RF ignition in a certain step. This may protect the antenna 65 itself and the equipment around the antenna 65 such as the sapphire glass 61. Thus, the lifespan of the equipment may be extended.

In addition, the recipe 108 in FIG. 5 omits the description of other process conditions such as the orbital and turning rotational speeds of the rotary table 2. The process execution unit 105 rotates the rotary table 2 around the central shaft 21 according to the orbital rotational speed set in the recipe, and rotates the wafer holder 24 around the rotating shaft 26 according to the turning rotational speed.

While controlling the rotation of the rotary table 2, the process execution unit 105 supplies a gas from a gas supply (e.g., gas nozzles 51 to 55) to a gas supply region on a portion of the surface of the rotary table 2, forming a film on the wafer W which repeatedly passes through the gas supply region due to orbital rotation. Furthermore, the wafer W, which repeatedly passes through the gas supply region, turns around its axis while orbiting via rotation of the wafer holder 24. During plasma generation, the wafer W passing below the sapphire glass 61 is subjected to plasma processing.

[Modifications]

Instead of automatically adjusting the position (height) of the antenna 65 using the electric actuator 140, the position (height) of the rotary table 2 may be automatically adjusted. Both the position (height) of the antenna 65 and the position (height) of the rotary table 2 may be automatically adjusted using the electric actuator 140.

The position (height) of the rotary table 2 may be automatically adjusted using the orbiting rotational driving unit 22. The orbiting rotational driving unit 22 is an example of a second driving unit configured to move the rotary table 2. The orbiting rotational driving unit 22 moves (raises and lowers) the rotary table 2 while rotating it around the central shaft 21 to automatically adjust the rotary table 2 to a determined position. In this case, the position of the rotary table 2 is stored in the ignition condition table 110 in association with the process condition 110*a*. Thus, the determination unit 104 refers to the ignition condition table 110 to determine the position of the rotary table corresponding to the process condition 110*a* of the ignition condition information that matches the process condition 108*a* set in the recipe. Then, the rotary table 2 is moved to the determined position of the rotary table by the orbiting rotational driving unit 22, and the plurality of wafers W are processed in that state. This allows stable plasma ignition while enhancing the in-plane uniformity of substrate processing.

The tilt angle of the antenna may also be automatically adjusted. The tilt angle of the antenna may be automatically adjusted using the electric actuator 140. At this time, a support 66' illustrated in FIG. 1 is connected to the right or left end of the antenna 65. In this configuration, a driving system (e.g., electric actuator 140, frame 141, fixing element 142, driving force transmitter 143, and support 66') of the plasma generator 180 is an example of a third driving unit configured to change the tilt angle of the antenna 65. The antenna 65 is tilted diagonally by raising the end of the antenna 65 with the electric actuator 140. This allows the antenna 65 to be automatically adjusted to a determined tilt angle.

In this case, the tilt angle of the antenna is stored in the ignition condition table 110 in association with the process condition 110*a*. Thus, the determination unit 104 refers to the ignition condition table 110 to determine the tilt angle corresponding to the process condition 110*a* of the ignition condition information that matches the process condition 108*a* set in the recipe. Then, the electric actuator 140 is driven to control the antenna 65 to the determined tilt angle, and then the plurality of wafers W are processed. This allows stable plasma ignition while enhancing the in-plane uniformity of substrate processing.

As described above, according to the substrate processing method of the present embodiment, it is possible to execute a process under appropriate ignition conditions.

When only one condition among the process conditions 110*a* of the ignition condition table 110 differs and the other conditions are the same, it is possible to select whether to perform linear interpolation for that one condition. For example, in FIG. 7, when the gas flow rate of Gas 1 is 1,000 sccm, the antenna position 110*b* is "Position 1." When the gas flow rate of Gas 1 is 1,100 sccm, the antenna position 110*b* is "Position 2." Assuming that the other process conditions [Gas 2 (gas flow rate), Gas 3 (gas flow rate), pressure, and RF power] are set to the same values. In a case where linear interpolation is selected for the recipe or specific parameters, when the gas flow rate of Gas 1 is 1,050 sccm, the antenna position may be determined as an intermediate position between "Position 1" and "Position 2" because the other process conditions are set to the same values. When "Position 1" is 1 mm above the origin position of the antenna 65 and "Position 2" is 2 mm above the origin position, the antenna 65 may be adjusted automatically to 1.5 mm above the origin position between "Position 1" and "Position 2."

The substrate processing apparatus for executing the substrate processing method according to the present embodiment has been described using the film forming apparatus 1 in FIG. 1 by way of example, but is not limited thereto. A substrate processing apparatus having a different configuration from the film forming apparatus 1 in FIG. 1 may be used as long as the substrate processing apparatus includes a vacuum container, a rotary table having a placement surface for placing a plurality of substrates thereon and configured to rotate the plurality of substrates, an antenna coupled to the vacuum container and configured to generate a plasma in the vacuum container, and a first driving unit configured to move the antenna.

According to an aspect, it is possible to execute a process under appropriate ignition conditions.

From the foregoing content, it will be appreciated that various embodiments of the present disclosure have been described herein for purposes of illustration, and that various modifications can be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   providing a substrate processing apparatus including:
      a vacuum container;
      a rotary table including a placement surface on which a plurality of substrates is disposed, and configured to rotate the plurality of substrates;
      a plasma generator including an antenna and configured to generate a plasma in the vacuum container; and
      a first driver configured to move the antenna;
   storing ignition condition information that associates a process condition and a position of the antenna with each other, in a storage;
   determining the position of the antenna corresponding to the process condition of the ignition condition information that matches a process condition set in a recipe by referring to the storage; and
   moving the antenna to the position of the antenna determined at the determining using the first driver, thereby processing the plurality of the substrates.

2. The substrate processing method according to claim 1, wherein the process condition of the ignition condition information is related to an ignition condition of the plasma.

3. The substrate processing method according to claim 2, wherein the process condition of the ignition condition information includes gas species, gas flow rate of the gas species, pressure in the vacuum container, and RF power supplied to the antenna.

4. The substrate processing method according to claim 1, wherein the storage stores a plurality of ignition condition tables storing a plurality of pieces of the ignition condition information, and
   an ignition condition table specified in the recipe is selected from the plurality of ignition condition tables, and the position of the antenna corresponding to the process condition of the ignition condition information that matches the process condition set in the recipe is determined from the plurality of pieces of ignition condition information of the selected ignition condition table.

5. The substrate processing method according to claim 1, wherein the substrate processing apparatus further includes a second driver configured to move the rotary table, the ignition condition information includes a position of the rotary table associated with the process condition, and the substrate processing method further comprises:

determining the position of the rotary table corresponding to the process condition of the ignition condition information that matches the process condition set in the recipe by referring to the storage; and moving the rotary table to the determined position of the rotary table using the second driver, thereby processing the plurality of the substrates.

6. The substrate processing method according to claim 1, wherein the substrate processing apparatus further includes a third driver configured to change a tilt angle of the antenna, the ignition condition information includes the tilt angle of the antenna associated with the process condition, and the substrate processing method further comprises:

determining the tilt angle of the antenna corresponding to the process condition of the ignition condition information that matches the process condition set in the recipe by referring to the storage; and tilting the antenna by the determined tilt angle of the antenna using the third driver, thereby processing the plurality of the substrates.

\* \* \* \* \*